(12) United States Patent
Fan et al.

(10) Patent No.: US 9,372,956 B1
(45) Date of Patent: Jun. 21, 2016

(54) INCREASED USABLE PROGRAMMABLE DEVICE DICE

(71) Applicant: Xilinx, Inc., San Jose, CA (US)

(72) Inventors: Yuezhen Fan, Los Gatos, CA (US); Eric J. Thorne, Santa Cruz, CA (US); Xiao-Yu Li, San Jose, CA (US); Glenn O'Rourke, Gilroy, CA (US); Stephen M. Trimberger, Incline Village, NV (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/537,295

(22) Filed: Nov. 10, 2014

(51) Int. Cl.
*G06F 9/455* (2006.01)
*G06F 17/50* (2006.01)

(52) U.S. Cl.
CPC .................................. *G06F 17/5081* (2013.01)

(58) Field of Classification Search
USPC .......................................... 716/106, 111, 112
See application file for complete search history.

(56) References Cited

U.S. PATENT DOCUMENTS

| | | | |
|---|---|---|---|
| 5,787,007 A | 7/1998 | Bauer | |
| 6,157,213 A | 12/2000 | Voogel | |
| 6,160,418 A | 12/2000 | Burnham | |
| 6,204,689 B1 | 3/2001 | Percey et al. | |
| 6,215,327 B1 | 4/2001 | Lyke | |
| 6,216,257 B1 | 4/2001 | Agrawal et al. | |
| 6,218,864 B1 | 4/2001 | Young et al. | |
| 6,359,466 B1 | 3/2002 | Sharpe-Geisler | |
| 6,396,303 B1 | 5/2002 | Young | |
| 6,448,808 B2 | 9/2002 | Young et al. | |
| 6,530,071 B1 * | 3/2003 | Guccione | G06F 17/5054 714/E11.111 |
| 6,944,809 B2 | 9/2005 | Lai et al. | |
| 7,002,828 B2 | 2/2006 | Santin et al. | |
| 7,028,281 B1 | 4/2006 | Agrawal et al. | |
| 7,047,465 B1 * | 5/2006 | Trimberger | G01R 31/2894 714/725 |
| 7,088,134 B1 | 8/2006 | Agrawal et al. | |
| 7,095,253 B1 | 8/2006 | Young | |
| 7,107,565 B1 | 9/2006 | Lindholm et al. | |
| 7,132,851 B2 | 11/2006 | Young | |
| 7,143,295 B1 * | 11/2006 | Trimberger | G01R 31/318555 713/189 |
| 7,181,718 B1 | 2/2007 | Bilski et al. | |
| 7,187,200 B2 | 3/2007 | Young | |
| 7,190,190 B1 | 3/2007 | Camarota et al. | |
| 7,193,433 B1 | 3/2007 | Young | |
| 7,196,543 B1 | 3/2007 | Young et al. | |
| 7,199,610 B1 | 4/2007 | Young et al. | |

(Continued)

OTHER PUBLICATIONS

Amerson, Rick et al., "Teramac—Configurable Custom Computing," *Proc. of the IEEE Symposium on FPGA's for Custom Computing Machines*, Apr. 19, 1995, pp. 32-38, IEEE Computer Society, Washington, DC, USA.

(Continued)

*Primary Examiner* — Brian Ngo
(74) *Attorney, Agent, or Firm* — Steven Roberts (57) ABSTRACT

A method of enabling the use of a programmable device having impaired circuitry includes determining one or more locations of the impaired circuitry of the programmable device; generating a defect map for the programmable device based on the determined locations of the impaired circuitry; generating a plurality of configuration bitstreams to implement a circuit in the programmable device; selecting one of the plurality of configuration bitstreams that does not use the impaired circuitry indicated by the defect map; and programming the programmable device with the selected configuration bitstream.

20 Claims, 9 Drawing Sheets

(56) References Cited

U.S. PATENT DOCUMENTS

| | | | |
|---|---|---|---|
| 7,202,697 B1 | 4/2007 | Kondapalli et al. | |
| 7,202,698 B1 | 4/2007 | Bauer et al. | |
| 7,205,790 B1 | 4/2007 | Young | |
| 7,215,138 B1 | 5/2007 | Kondapalli et al. | |
| 7,218,139 B1 | 5/2007 | Young et al. | |
| 7,218,140 B1 | 5/2007 | Young | |
| 7,218,143 B1 | 5/2007 | Young | |
| 7,221,186 B1 | 5/2007 | Young | |
| 7,228,521 B1 * | 6/2007 | Ma | G11C 29/88 714/25 |
| 7,233,168 B1 | 6/2007 | Simkins | |
| 7,251,804 B1 | 7/2007 | Trimberger | |
| 7,253,658 B1 | 8/2007 | Young | |
| 7,256,612 B1 | 8/2007 | Young et al. | |
| 7,265,576 B1 | 9/2007 | Kondapalli et al. | |
| 7,268,587 B1 | 9/2007 | Pham et al. | |
| 7,274,214 B1 | 9/2007 | Young | |
| 7,276,934 B1 | 10/2007 | Young | |
| 7,279,929 B1 | 10/2007 | Young | |
| 7,284,226 B1 | 10/2007 | Kondapalli | |
| 7,301,824 B1 | 11/2007 | New | |
| 7,310,758 B1 | 12/2007 | Cossoul et al. | |
| 7,314,174 B1 | 1/2008 | Vadi et al. | |
| 7,337,422 B1 | 2/2008 | Becker et al. | |
| 7,339,400 B1 | 3/2008 | Walstrum et al. | |
| 7,345,507 B1 | 3/2008 | Young et al. | |
| 7,402,443 B1 | 7/2008 | Pang et al. | |
| 7,412,635 B1 | 8/2008 | Trimberger | |
| 7,424,655 B1 | 9/2008 | Trimberger | |
| 7,451,421 B1 | 11/2008 | Bauer et al. | |
| 7,491,576 B1 | 2/2009 | Young et al. | |
| 7,498,192 B1 | 3/2009 | Goetting et al. | |
| 7,619,438 B1 | 11/2009 | Trimberger | |
| 7,620,863 B1 | 11/2009 | Trimberger | |
| 7,710,813 B1 * | 5/2010 | Im | G11C 17/18 365/225.7 |
| 7,810,059 B1 | 10/2010 | Trimberger | |
| 7,849,435 B1 | 12/2010 | Trimberger | |
| 7,853,916 B1 | 12/2010 | Trimberger et al. | |
| 8,001,511 B1 | 8/2011 | Bauer et al. | |
| 8,117,580 B1 | 2/2012 | Trimberger | |
| 2003/0116835 A1 | 6/2003 | Miyamoto et al. | |
| 2004/0060032 A1 | 3/2004 | McCubbrey | |
| 2005/0112614 A1 | 5/2005 | Cook et al. | |
| 2007/0035330 A1 | 2/2007 | Young | |
| 2007/0204252 A1 | 8/2007 | Furmish et al. | |

OTHER PUBLICATIONS

Belarussian Academy of Sciences Network, *Nano Resources and the HP Teramac Computer*, downloaded Oct. 17, 2014, http://www.ednes.org/staccis/basnet/projects/teramac.html, Belarussian Academy of Sciences Network, Minsk, Republic of Belarus.

Kahn, Michael, *The next breakthrough: Chemical Computers?*, Jun. 12, 1998, pp. 1-4, http://www.zdnet.com/news/the-next-breakthrough-chemical-computers/99738.

Rotman, David, *Molecular Computing*, May 1, 2000, MIT Technical Review, Cambridge, Massachusetts, USA.

Rubin, Raphael et al., "Choose-Your-Own-Adventure Routing: Lightweight Load Time Defect Avoidance," *Proceedings of the 17th ACM/SIGDA International Symposium on Field-Programmable Gate Arrays*, Feb. 22, 2009, pp. 23-32, ACM, New York, New York, USA.

Trimberger, Steve, *Defect Avoidance in Programmable Devices*, Mar. 2014, pp. 1-24, Xilinx, Inc., San Jose, California, USA.

Zhang, An, *What does the HP Teramac have to do with the moletronics?*, Michigan State University, Department of Computer Sciences, downloaded Oct. 17, 2014, http://www.collegetermpapers.com/TermPapers/Com/What_does_the_HP_Teramac_have_to_do_with_the_moletronics.html.

* cited by examiner

INCREASED USABLE PROGRAMMABLE DEVICE DICE

TECHNICAL FIELD

Examples of the present disclosure generally relate to integrated circuits (ICs) and, more particularly, to enabling the use of programmable devices having impaired circuitry.

BACKGROUND

In manufacturing and utilizing integrated circuits (ICs) such as programmable ICs, it is important that the programmable ICs operate properly in a system. Example programmable ICs include field programmable gate arrays (FPGAs), complex programmable logic devices (CPLDs), and the like, including various system-on-chip (SoC) implementations of such devices having embedded processing systems. When a completed integrated circuit malfunctions after it has been installed in a system, such as a consumer electronics product, the malfunction of the integrated circuit may cause the entire product to fail. As programmable ICs are manufactured according to smaller dimensions, defects in some of the circuits are becoming more common. Further, the increased complexity of programmable ICs, such as an increased number of layers, has also increased the possibility for electrical faults. Finally, the die size of programmable ICs has also continued to increase, and therefore, has increased the likelihood of defects.

Programmable ICs are typically tested after fabrication. In order to avoid causing problems for end users, a programmable IC is generally discarded if it contains defects that affect the active logic. The percentage of usable ICs is called the "yield," because it indicates the fraction of usable ICs in a manufactured lot. The increase in programmable IC size and density has led to an increase in the percentage of defective dice, and a corresponding decrease in product yield. A low yield has a significant economic impact on programmable IC providers. While dice having gross defects that cause the failure of an entire programmable device should be discarded, dice having localized defects that cause the failure of small portions of the programmable device circuitry may be salvaged by using only the portion of the device not having defects. One known method for using partially defective programmable devices is to sort out those devices that are defective only in an isolated function or area. The programmable device provider may sell these partially defective devices to a customer at a reduced price, rather than discarding them.

While such a use of defective programmable devices may increase the yield, there is also an associated cost of managing the defective devices. Because defects may be present in different locations for different devices, managing defective integrated circuits may be time consuming and expensive. Integrated circuits are commonly binned according to performance, such as operating speed, as well as for pass versus fail. Defective integrated circuits may be binned according to the locations of defects, for example. Consequently, each of the bins of integrated circuits having different defects are typically separately managed. Such a management obligation may be costly for a producer of programmable devices and increase the cost of selling the defective programmable devices.

SUMMARY

One example of the present disclosure is a method of enabling the use of a programmable device having impaired circuitry. The method generally includes determining one or more locations of the impaired circuitry of the programmable device; generating a defect map for the programmable device based on the determined locations of the impaired circuitry; generating a plurality of configuration bitstreams to implement a circuit in the programmable device; selecting one of the plurality of configuration bitstreams that does not use the impaired circuitry indicated by the defect map; and programming the programmable device with the selected configuration bitstream.

Another example of the present disclosure is a non-transitory computer-readable medium for enabling the use of a programmable device having impaired circuitry. The computer-readable medium generally includes instructions executable by a processing system to determine one or more locations of the impaired circuitry of the programmable device; to generate a defect map for the programmable device based on the determined locations of the impaired circuitry; to generate a plurality of configuration bitstreams to implement a circuit in the programmable device; to select one of the plurality of configuration bitstreams that does not use the impaired circuitry of the programmable device indicated by the defect map; and to program the programmable device with the selected configuration bitstream.

Yet another example of the present disclosure is an apparatus for enabling the use of a programmable device having impaired circuitry. The apparatus generally includes a processing system and a memory coupled to the processing system. The processing system is generally programmed to determine one or more locations of the impaired circuitry of the programmable device; to generate a defect map for the programmable device based on the determined locations of the impaired circuitry; to generate a plurality of configuration bitstreams to implement a circuit in the programmable device; to select one of the plurality of configuration bitstreams that does not use the impaired circuitry indicated by the defect map; and to program the programmable device with the selected configuration bitstream. The memory is typically configured to store at least one of instructions for the processing system, the indication of the locations of the impaired circuitry, the defect map, or the plurality of configuration bitstreams.

Yet another example of the present disclosure is a method of enabling the use of programmable devices having impaired circuitry (e.g., one or more defective and/or suspect portions). The method generally includes performing functional testing for each programmable device of a plurality of programmable devices; identifying each programmable device of the plurality of programmable devices that has impaired circuitry; identifying, for each programmable device that is identified to have impaired circuitry, one or more locations of the impaired circuitry; storing, for each programmable device that is identified to have impaired circuitry, an indication of the locations of the impaired circuitry in at least one of: (1) a non-volatile memory (e.g., a one-time programmable register) of the programmable device; or (2) a database, wherein a defect map may be generated for the programmable device based on the locations of the impaired circuitry.

Yet another example of the present disclosure is a programmable device having impaired circuitry. The programmable device generally includes a first memory (e.g., a one-time programmable register) configured to store an indication of one or more locations of the impaired circuitry; and a second memory configured to store at least a portion of a selected configuration bitstream, wherein the selected configuration bitstream is selected from a plurality of configuration bitstreams based upon the indication stored in the first memory.

The one-time programmable register may be an electronically fused register where the indication of the locations comprises a combination of blown and pristine fuse links in the electronically fused register.

Yet another example of the present disclosure is an apparatus for enabling the use of programmable devices having impaired circuitry. The apparatus generally includes means for performing functional testing for each programmable device of a plurality of programmable devices; means for identifying each programmable device of the plurality of programmable devices that has impaired circuitry; means for identifying, for each programmable device that is identified to have impaired circuitry, one or more locations of the impaired circuitry; means for storing, for each programmable device that is identified to have impaired circuitry, an indication of the locations of the impaired circuitry in at least one of: (1) a non-volatile memory (e.g., a one-time programmable register) of the programmable device; or (2) a database, wherein a defect map may be generated for the programmable device based on the locations of the impaired circuitry.

Yet another example of the present disclosure is an apparatus for enabling the use of a programmable device having impaired circuitry. The apparatus generally includes a processing system and a memory coupled to the processing system. The processing system is generally programmed to determine one or more locations of the impaired circuitry of the programmable device; to generate a defect map for the programmable device based on the determined locations of the impaired circuitry; to generate a plurality of configuration bitstreams to implement a circuit in the programmable device; to select one of the plurality of configuration bitstreams that does not use the impaired circuitry indicated by the defect map; and to program the programmable device with the selected configuration bitstream. The memory is typically configured to store at least one of instructions for the processing system, the indication of the locations of the impaired circuitry, the defect map, or the plurality of configuration bitstreams.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide techniques and apparatus for enabling the use of programmable devices having impaired circuitry (e.g., a defective and/or suspect portion) in an effort to increase overall device yield. As used herein, the term "impaired circuitry" generally refers to circuitry that functions poorly or inadequately and may include defective circuitry, degraded circuitry, suspect circuitry, and the like. For some examples, the impaired circuitry may include only defective circuitry, only suspect circuitry, or both. The impaired circuitry for each programmable device may be isolated and characterized during production test, and an indication of the location(s) of the impaired circuitry may be stored in a database (e.g., in "the cloud") and/or in a non-volatile memory (e.g., an electronically fused register) on the device. Subsequently, the device is programmed with a configuration bitstream that avoids the location(s) of the impaired circuitry, the bitstream being selected from a plurality of predetermined configuration streams for a particular application based on the stored indication of the location(s).

Example Programmable Device Architecture

Figure 1:
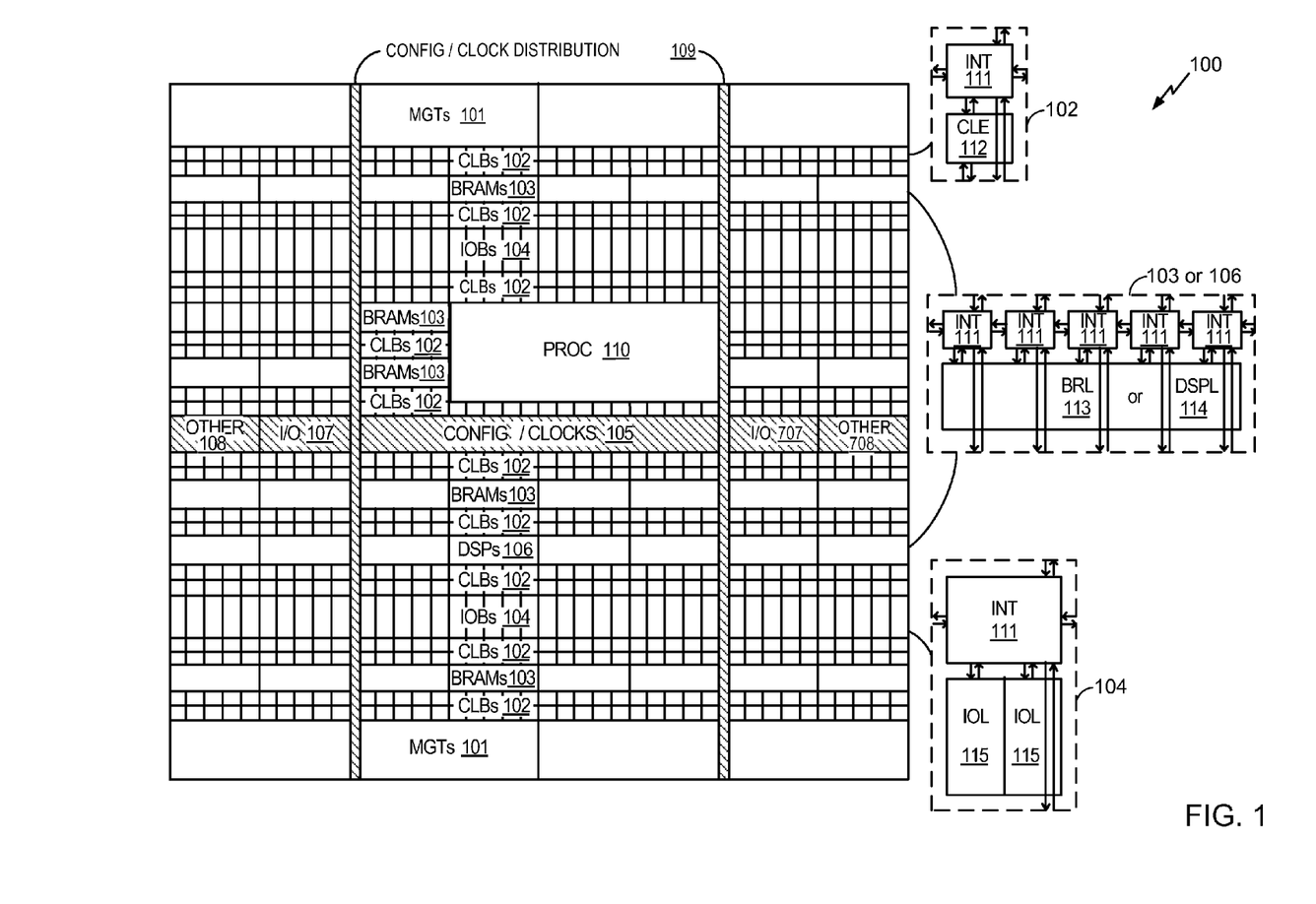
FIG. 1 is a block diagram illustrating an example architecture for a programmable device, in accordance with an example of the present disclosure.

FIG. 1 is a block diagram illustrating an example architecture 100 for a programmable device, in accordance with an example of the present disclosure. The architecture 100 may be implemented within a field programmable gate array (FPGA), for example. As shown, the architecture 100 includes several different types of programmable circuit, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are purely exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

As described below, defective areas (or areas with questionable performance) of the programmable device of FIG. 1 may be used to define defective or suspect regions thereof.

Example Testing System

Figure 2:
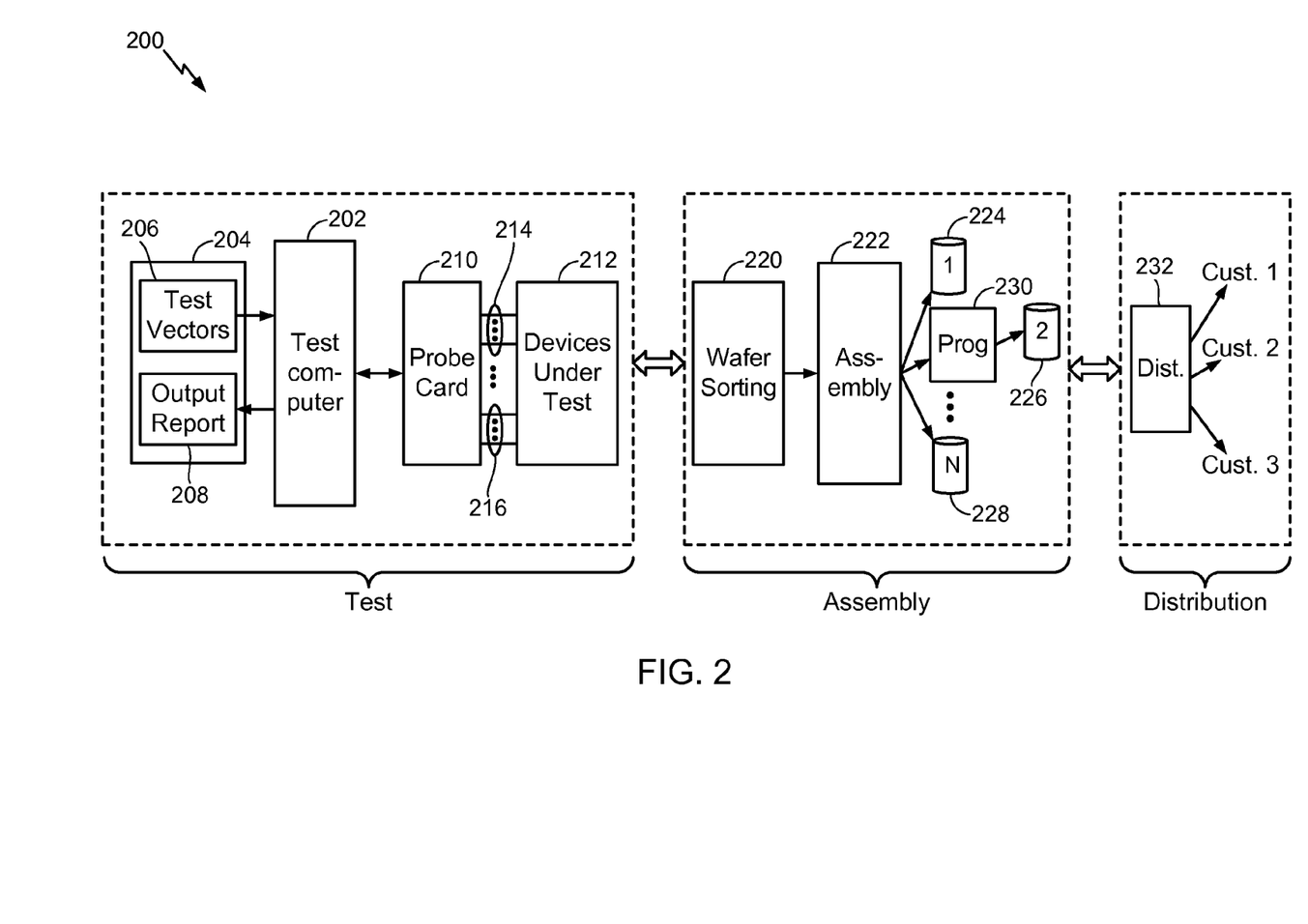
FIG. 2 is a block diagram illustrating an example system for distributing integrated circuits having programmable logic, in accordance with an example of the present disclosure.

Turning now to FIG. 2, a block diagram of a system 200 for distributing integrated circuits having programmable logic according to an example of the present disclosure is shown. In particular, after dice on wafers are tested, the individual dice are assembled as packaged integrated circuits (ICs) and distributed to customers. For programmable devices, the packaged integrated circuits may be programmed by a manufacturer or distributor, enabling a customer to assemble devices incorporating the packaged integrated circuits and to sell the devices to end users. Alternatively, the packaged integrated circuits may be provided to customers to program and assemble in a device.

As shown in FIG. 2, a test computer 202 is configured to receive a plurality of test vectors 206 of a test program 204 and to generate an output report 208, which is based upon outputs of a probe card 210 applied to devices under test 212. Dice are tested to determine both whether the dice are defective and the performance characteristics of the dice, and defective dice may be discarded. While reference is made to a probe card, the probe card 210 may comprise any device or fixture having a plurality of probes. As will be described in more detail below, the probe card 210 is coupled to devices under test 212 by a plurality of probe sites including probe sites 214 and 216 shown in FIG. 2. Although two probe sites are shown, a probe card 210 may include many probe sites, where each probe site includes a number of probes.

A wafer sorting machine 220 enables wafers to be processed in batches. Examples of wafer sorters are generally available from Credence Systems Corporation of Milipitas, Calif. or Teradyne, Inc. of Boston, Mass., and are well known in the art of semiconductor manufacturing. After wafer sorting, the wafers are removed from the wafer sorter and moved to assembly equipment 222, where the wafers are sliced into individual dice for assembly. The packaging of dice that are not determined to be defective is performed during the assembly process. The assembled integrated circuits are then sorted according to any criteria, such as speed, to bins 224, 226, and 228, for example. However, according to one example of the present disclosure, integrated circuits having defective programmable logic are binned in a separate bin, and more particularly, in a common bin 226. That is, integrated circuits having defective programmable logic may be binned in a common bin regardless of the location of the defective programmable logic.

According to an example of the present disclosure, the location(s) of the impaired circuitry (e.g., the defective and/or borderline portion that barely passes certain tests) are recorded for each integrated circuit. For example, each integrated circuit having impaired circuitry may be separately programmed to indicate the location(s) of the impaired circuitry. For example, a one-time programmable register, such as an electronically fused register, may be used to store an indication of the location(s) of the impaired circuitry. In this case, the indication of the location(s) is a combination of blown and pristine (i.e., never blown) fuse links in the electronically fused register. Alternatively or additionally, a record in a computer database external to a programmable device may be created to indicate the location(s) of impaired circuitry in the programmable device. This database may be stored on a cloud computing server, for example, and be accessible via "the cloud." The location(s) of the impaired circuitry may be stored as a record in the database indexed by an identifier associated with the device that is readable on the device, such as a bar code, a serial number, electronically-stored device serial number, or some other unique identifier for the device. For example, a unique, 57-bit "Device DNA" identifying the programmable device may be stored in the electronically fused register on the device and may be used to access the corresponding database record and determine the location(s) of the impaired circuitry for that particular programmable device. Rather than (or in addition to) storing an indication in a memory of the device, the location(s) of the impaired circuitry may be stored on the device itself by physically marking the device with some identifier indicating the location(s).

Assembled packaged integrated circuits are shipped during a distribution process, where a distribution channel 232 enables integrated circuits to be shipped to customers. During the distribution process, the integrated circuits may further be programmed with one of a plurality of configuration bitstreams for a single user specific design that avoids the impaired circuitry, or without the user specific design, enabling them to instead be programmed by customers as will be described in more detail below.

Figure 3:
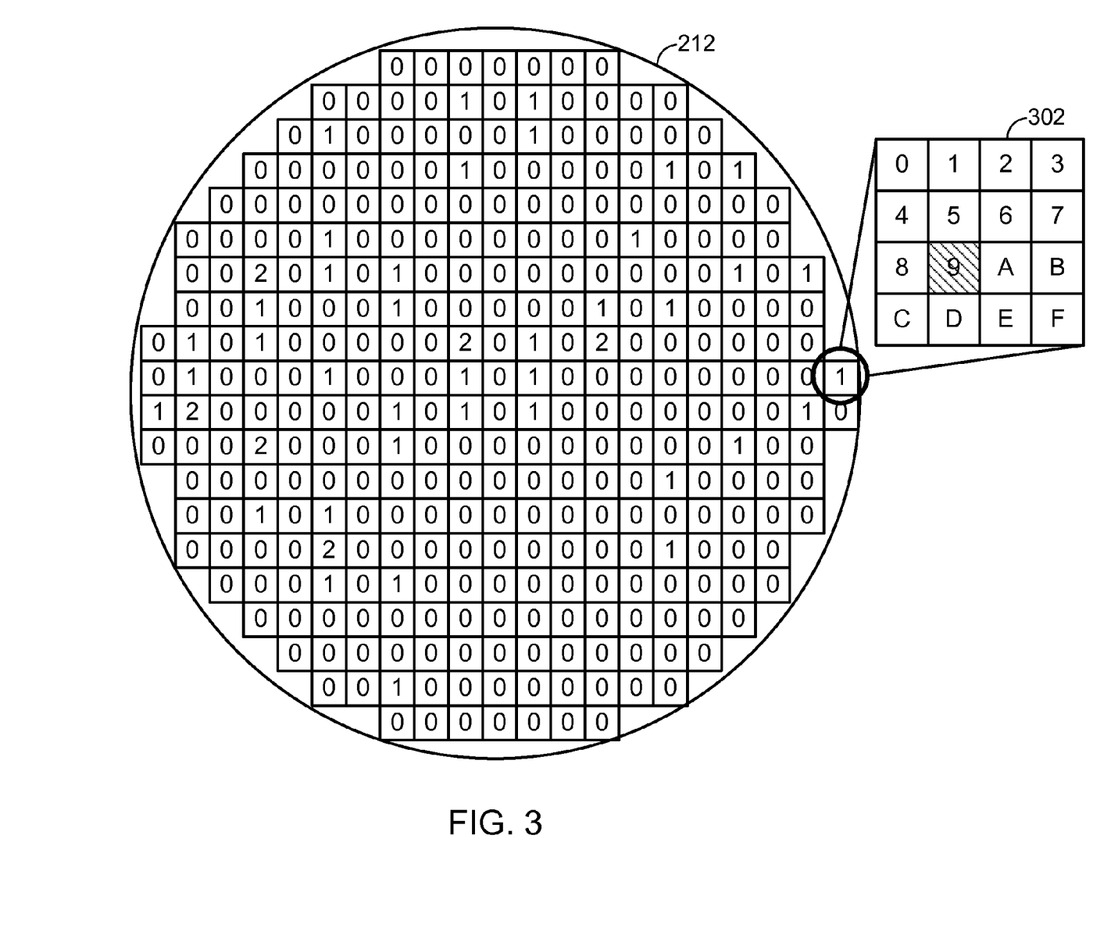
FIG. 3 is a top plan view of a semiconductor wafer having a plurality of dice including dice with impaired circuitry, in accordance with an example of the present disclosure.

Moving now to FIG. 3, a top plan view shows a wafer having a plurality of dice including defective dice according to an example of the present disclosure. In particular, a device under test 212 comprises a wafer having various dice that are designated with a number indicating the defect status of the device. For example, a designation of "0" may indicate that the device has no defects in the programmable logic, a designation of "1" may indicate that a portion of the programmable logic is defective, and a designation of "2" may indicate that the die has gross defects. A designation of "3" may indicate that the device has no defects per se, but that one or more parameters of the device are borderline (i.e., barely passing a test limit, such as a timing specification).

An expanded view of a die of the wafer shows a programmable device 302 having defects in programmable logic. In particular, the die is divided into a plurality of regions. In the example of FIG. 3, the die is divided into 16 regions 0-F, where the shaded region 9 contains defective programmable logic. The location of the defective region may be identified, for example, according to the physical location of the defects on the die.

The regions need not be the same size or evenly distributed on the die, and the method used to identify defective regions of a device may depend on the layout and functional design of the device. The regions may be partitioned according to geographic region of the overall die (as in the example of FIG. 3), geographic region of a particular portion of a die, such as a geographic region of a programmable portion of the die (e.g., a programmable logic portion of an application specific integrated circuit (ASIC)), or any portion of a particular type of circuit of a programmable device (e.g., a geographic region of the configurable logic blocks (CLBs) of the programmable logic portion, such as a portion of a row of CLBs, as described above).

For some examples, regions are not defined by physical locality, but are convenient collections of physical resources that may all be avoided simultaneously by placement and routing software. For other examples, regions are defined by the functionality of the defective programmable logic, programmable logic identified by the application of predetermined test vectors, or any other designation of a region that would enable a user or programming device to avoid the defective programmable logic in the device.

For some examples, the regions are determined based on the vectors in a test program. In one example, one region corresponds to a failure of one of the test vectors. Depending on the test suite, there may be tens, hundreds, thousands, millions, or greater numbers of test vectors. In another example, one region corresponds to a failure of any one of a subset of test vectors. In yet another example, one region corresponds to a failure of multiple, pre-defined test vectors. The number of regions being 16 in device 302 is only an example used to illustrate the concepts described herein, but in practice, this number of regions may be different (e.g., up to the number of test vectors). For example, the number of regions may be in the millions.

As described in more detail below, the programmable device may be programmed to implement a design according to a layout that avoids the impaired circuitry (e.g., the defective or suspect region). Although a single defective region is shown by way of example, multiple defective (or suspect) regions may be identified, where the device is programmed to avoid all of the identified defective (and suspect) regions.

Example Programming System

Figure 4:
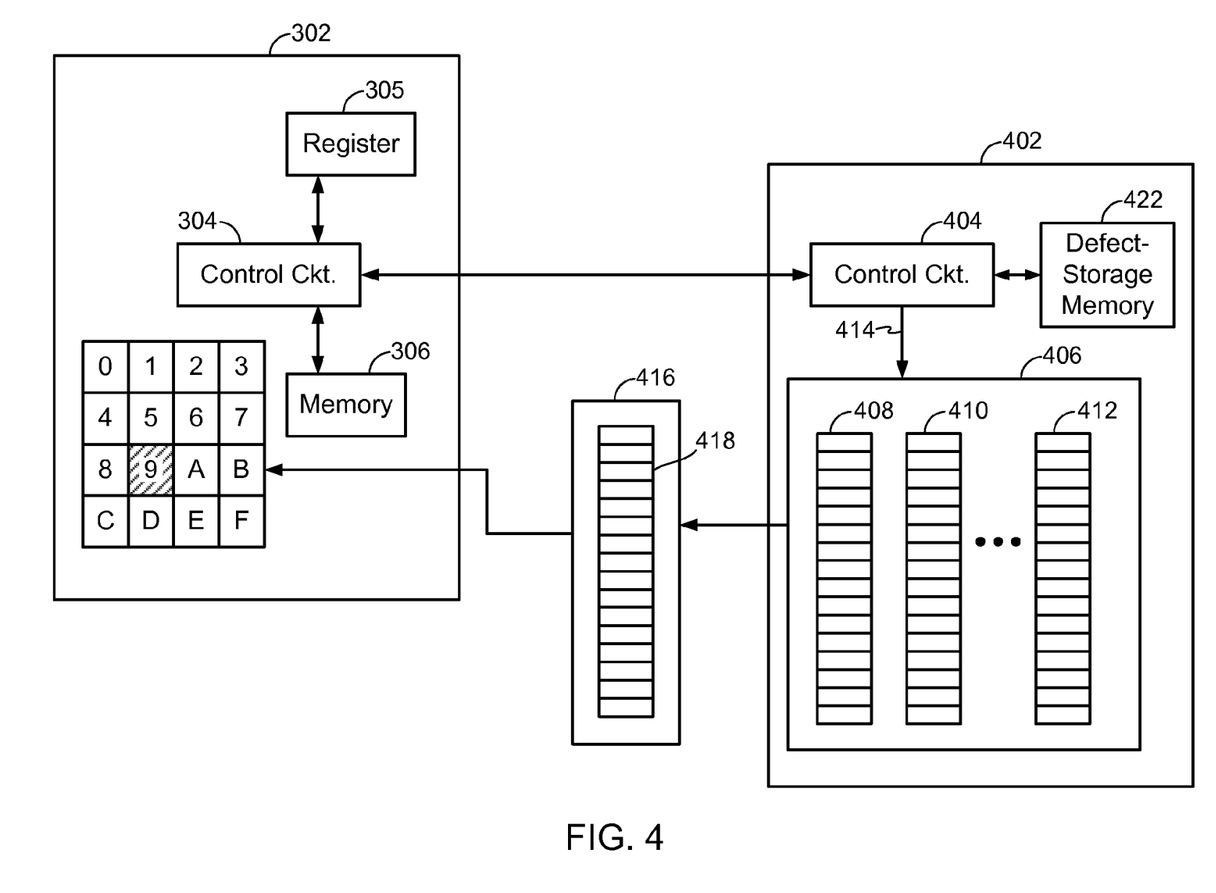
FIG. 4 is a block diagram illustrating an example programming system for enabling the use of a programmable device having impaired circuitry, in accordance with an example of the present disclosure.

FIG. 4 is a block diagram illustrating an example programming system for enabling the use of a programmable device having impaired circuitry, in accordance with an example of the present disclosure. A device 302 having programmable logic may include a non-volatile memory 306, a one-time programmable register 305, and a control circuit 304 enabling communication with a programming device 402. The control circuit 304 may comprise a processor, for example, or a logic circuit enabling reading from and writing to the memory 306. The control circuit 304 may also comprise a configuration controller.

The one-time programmable register 305 may be an electronically fused register, in which a bit in the register is programmed by "blowing" a fuse link. A programmed fuse (i.e., a blown fuse) may be assigned a logic value of 1, whereas a pristine fuse may be assigned a logic value of 0. The register 305 may store a unique identifier for the programmable device 302 (e.g., programmed when the device was manufactured), as well as bitstream encryption information, a user-defined code, and information about the read/write status of the register. For some examples, the register 305 may also store an indication of the location(s) of the impaired circuitry, which according to the example of FIG. 4 would be an indication that the impaired circuitry is in region 9.

The programming device 402 may comprise a control circuit 404 configured to communicate with the device 302 and a memory 406 configured to store a plurality of configuration bitstreams 408-412 associated with a plurality of implementations of a given design. In other words, the configuration bitstreams all implement the same design, but each in a different fashion using varied regions. The control circuit 404 is configured to select one of the configuration bitstreams by way of a selection signal 414. A non-volatile memory 416 is configured to receive the selected configuration bitstream 418, which is typically loaded into the device 302 at startup. Although the non-volatile memory 416 is shown separate from the device 302 in FIG. 4, the non-volatile memory 416 storing the selected configuration bitstream may be on the device 302 (e.g., part of the non-volatile memory 306).

For some examples where the indication of the location(s) of the impaired circuitry is stored in the register 305, the control circuit 404 may select one of the configuration bitstreams based upon this indication communicated from the control circuit 304 of the device 302. Alternatively or additionally, the control circuit 404 may receive a unique device identifier (e.g., stored in the register 305) from the device 302. The control circuit 404 may then use this device identifier to index a database and receive an indication of the location(s) of the impaired circuitry therefrom. The control circuit 404 may store this indication in a defect-storage memory 422 in order to select one of the configuration bitstreams 408-412. That is, the selected configuration bitstream 418 may be determined based upon data in the defect-storage memory 422.

Example Operations

Figure 5:
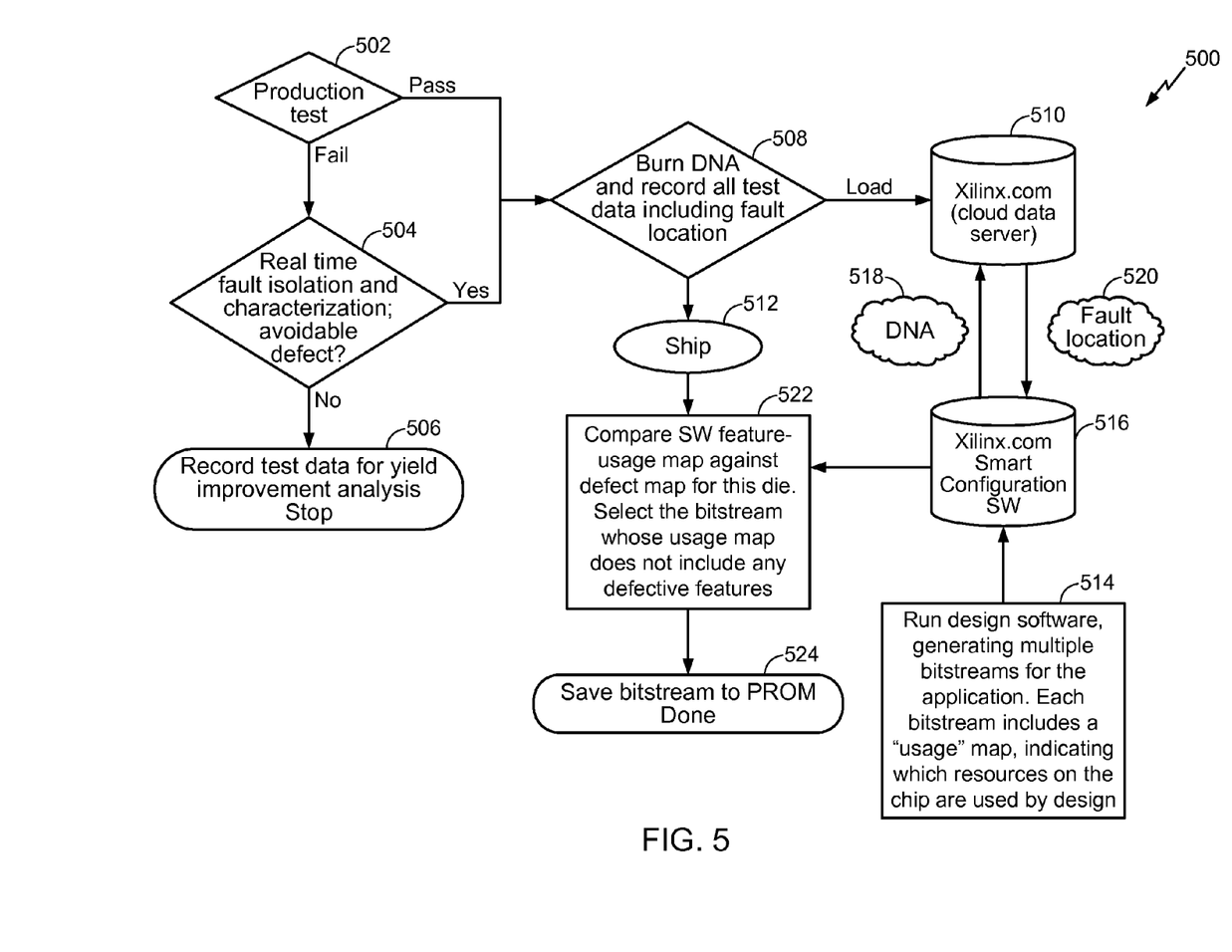
FIG. 5 is a flow diagram of example operations for enabling the use of programmable devices having impaired circuitry, in accordance with an example of the present disclosure.

FIG. 5 is a flow diagram of example operations 500 for enabling the use of programmable devices having impaired circuitry, in accordance with an example of the present disclosure. A first portion of the operations 500 may be performed, for example, by a manufacturing entity that fabricates programmable devices, such as a programmable device testing system. Occurring after the first portion, a second portion of the operations 500 may be performed, for example, by a programming entity that programs the programmable device with a configuration bitstream, such as a customer programming system.

Figure 6:
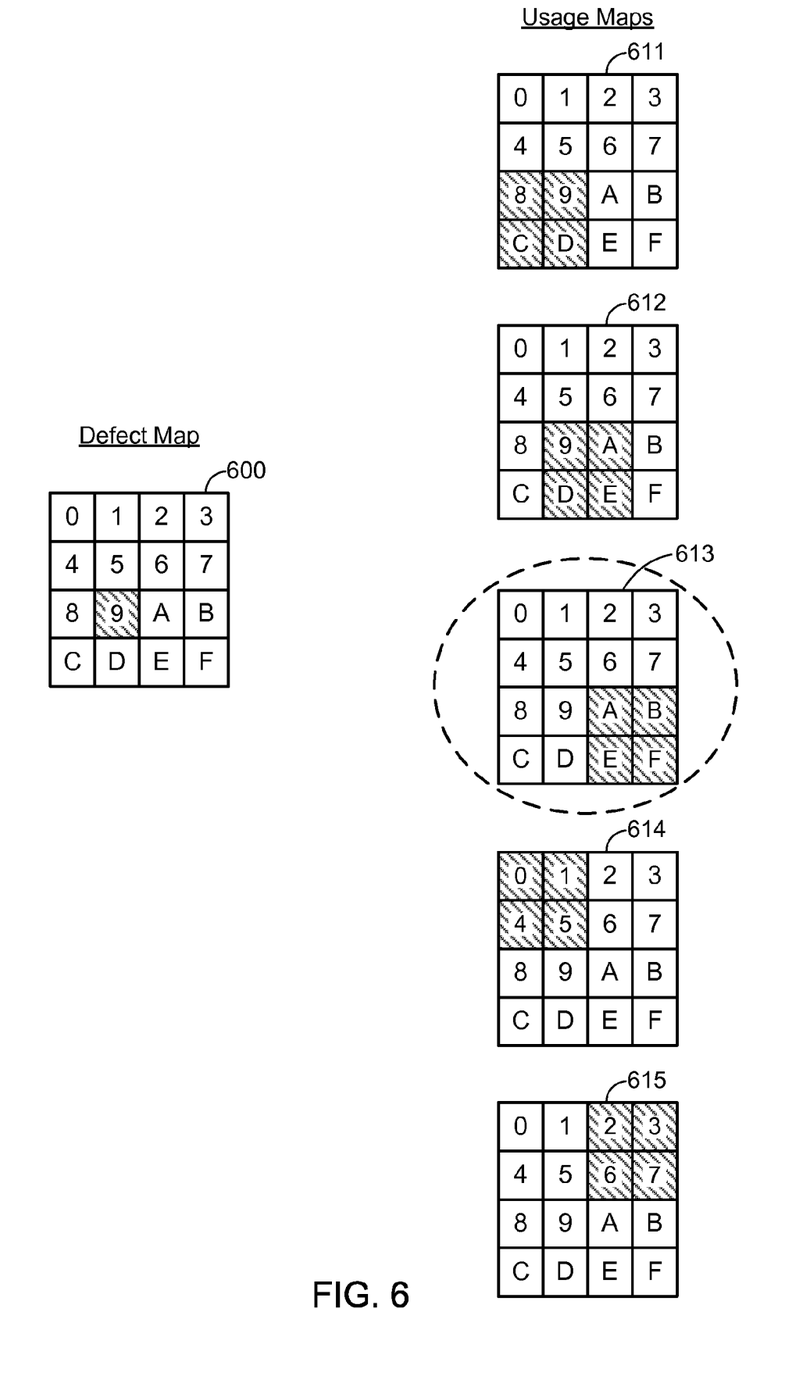
FIG. 6 conceptually illustrates comparing a defect map to a plurality of resource usage maps, in accordance with an example of the present disclosure.

At 502, the testing system runs a set of production tests on a programmable device die, such as an FPGA or CPLD die. As described above, there may be tens, hundreds, thousands, millions, or greater numbers of production tests in this set. If the die fails one or more of these production tests (or barely passes certain tests) at 502, the testing system may generate a map of impaired circuitry (e.g., defective and/or borderline locations and features) on the die at 504. Such a map is generally referred to herein as a defect map 600, as illustrated in FIG. 6.

This defect map can be as fine or as coarse as desired to pinpoint impaired circuitry locations on the die (also referred to as regions above). For example, the defect map may be as broad as whole CLBs and BRAMs or an entire stacked silicon interconnect technology (SSIT) slice. However, having to avoid such relatively larger features may lead to lower programmable device yields than using smaller features on the die. Therefore, yields may be increased by localizing the impaired circuitry to a multiplexer (MUX) input, a lookup table (LUT) bit, or an interconnect wire, for example. As a result, the number of regions may be correspondingly larger, potentially in the millions or billions. In the example defect map 600, region 9 is characterized as being defective (or at least borderline).

Many different encodings are possible for a defect map. For some examples, the defect map may contain an indication of the functionality of each region, while for other examples, the defect map may contain an address or identifier of a faulty region or multiple faulty regions. The defect map may contain an indication of defective regions and/or borderline regions with limitations thereof.

If the defect is catastrophic for operation of the device or the defective portion is unavoidable as determined at 504, then the die may be discarded at 506. The testing system may record the test data for further yield improvement analysis. If either the die passed all the production tests at 502 or the defective portion is determined to be avoidable at 504, then at 508 a unique identifier (e.g., a 57-bit Device DNA) may be programmed on the device die, such as in the one-time programmable register or other non-volatile memory (NVM). For example, the testing system may program this unique identifier on the die by blowing certain links to an electronically fused register to program logic 1s of the identifier. The testing system may also record all or a certain portion of the production test results at 508, including the location(s) of the impaired circuitry.

For some examples, the testing system may store an indication of the location(s) of the impaired circuitry in the one-time programmable register on the die. Alternatively or additionally for some examples, the testing system may upload an indication of the location(s) of the impaired circuitry to a database operating on a server, such as a cloud computing server 510, which may be accessible via www.xilinx.com or another URL. The testing system may also upload to the database the unique identifier for the die, and the database record with the indication of the location(s) may be indexed by the unique identifier. At 512, the device die may be packaged and shipped to distributors or customers.

After receiving the programmable device, the programming system may compile a design for the programmable device to run a desired application at 514. When compiling the design, the programming system design software (e.g., Vivado®, available from Xilinx, Inc. of San Jose, Calif.) may generate multiple bitstreams (e.g., bitstreams 408-412) for the features used in the design, all of which meet the customer performance specifications. These features may be on par with the localization of impaired circuitry used during fault isolation and characterization at 504 (i.e., the same coarse or fine level as the defect map 600). Each bitstream has a corresponding "usage map" indicating which resources on the programmable device are used by the design. For example, FIG. 6 illustrates five different usage maps 611-615, each using a unique set of four regions of the programmable device. Usage maps 611 and 612 incorporate the defective region 9 as indicated in the defect map 600, whereas usage maps 613-615 avoid the defective region 9 in their implementations of the customer's design. Although five usage maps 611-615 are illustrated as an example, the design software may generate a greater or fewer number of usage maps. The usage map may be a bit map with substantial compression, since typical programmable device designs utilize only about 25% of the features.

Configuration software 516 may retrieve the indication of the location(s) of the impaired circuitry from the one-time programmable register of the programmable device for some examples. Alternatively or additionally, the configuration software 516 may read the unique identifier from the programmable device and send a message 518 indicating this identifier to the database operating on a server, such as the cloud computing server 510. Based on the identifier, the database may access the record for the corresponding programmable device and send a message 520 indicating the location(s) of the impaired circuitry to the configuration software 516.

According to some examples, the configuration software 516 may be separate and distinct from the programming system design software. For some examples, the configuration software 516 may run on the programming system, while in other examples, the configuration software 516 may operate on a remote server (e.g., a cloud computing server), with which the programming system may communicate. For example, the configuration software 516 may be supplied and maintained by the manufacturing entity that fabricated the programmable device, or at least be under the direction of this entity. For other examples, the configuration software 516 may run on the programmable device itself (e.g., on a multi-core computer).

Based on the location(s) of the impaired circuitry, the configuration software 516 may generate the defect map 600. The configuration software 516 may also generate the usage maps 611-615 based on the configuration bitstreams produced by the design software at 514. At 522, the configuration software 516 may compare the usage maps 611-615 to the defect map 600 for this particular die. This comparison may be very fast since it may involve a simple AND-like check. The configuration software 516 selects a resource usage map (and its corresponding bitstream) that avoids the impaired circuitry indicated by the defect map 600. In the example of FIG. 6, the configuration software 516 selects usage map 613 since this resource usage avoids defective region 9. The configuration software 516 could have also selected usage map 614 or 615.

At 524, the programming system saves the selected configuration bitstream (corresponding to the selected usage map) in memory on the programmable device. This memory may be a programmable read-only memory (PROM), for example.

In this manner, each programmable device may be individually and intelligently programmed to implement the customer's design, but avoid impaired circuitry particular to that programmable device. Therefore, multiple programmable devices having different impaired circuitry may all implement the customer's design, but use different resources.

Figure 7:
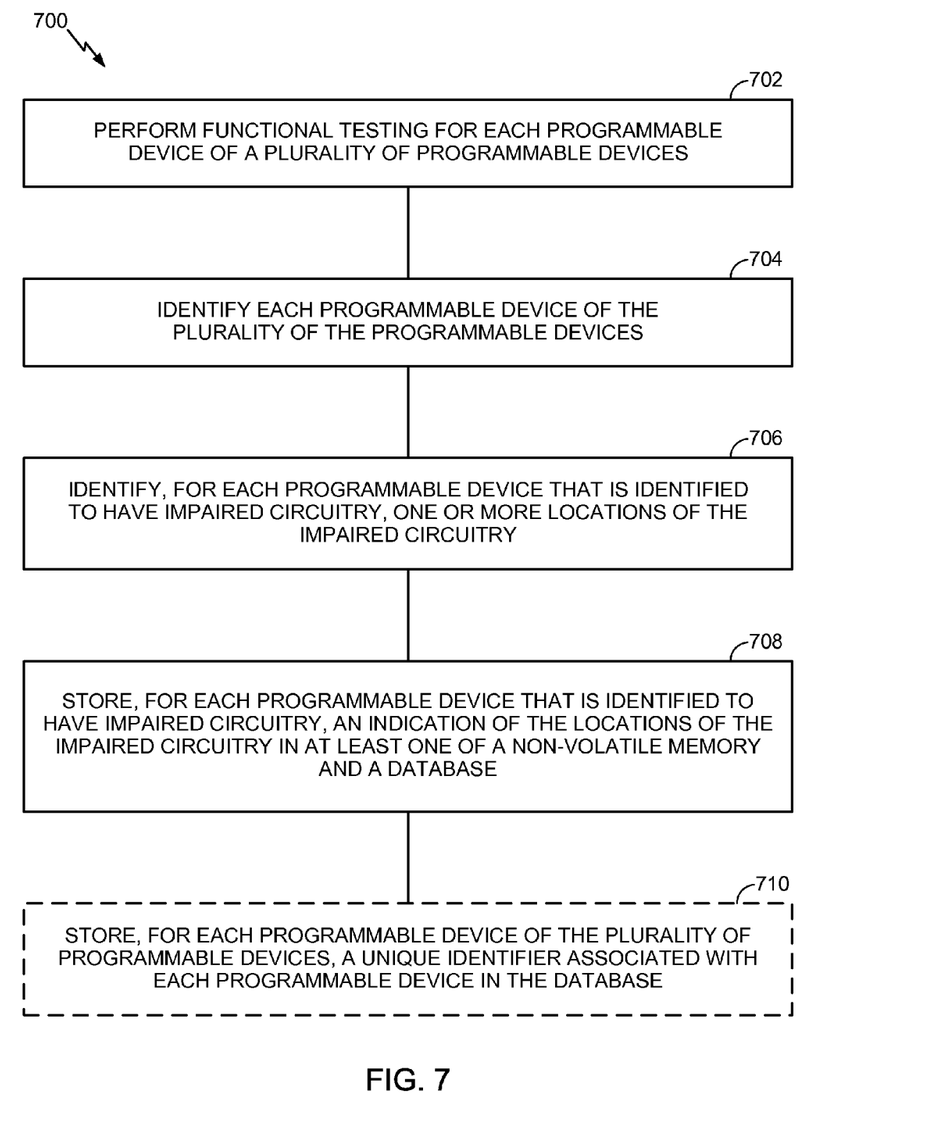
FIG. 7 is a flow diagram of example operations for enabling the use of programmable devices having impaired circuitry, from the perspective of a manufacturing entity, in accordance with an example of the present disclosure.

FIG. 7 is a flow diagram of example operations 700 for enabling the use of programmable devices having impaired circuitry, from the perspective of a manufacturing entity, for example. The operations 700 may be performed, for example, by a testing system, such as the test computer 202 and the probe card 210 in the system 200 of FIG. 2.

The operations 700 may begin, at block 702, with the testing system performing functional testing for each programmable device of a plurality of programmable devices. At block 704, testing system may identify each programmable device of the plurality of programmable devices that has impaired circuitry (e.g., a defective and/or suspect portion in a programmable device).

At block 706, the testing system may identify, for each programmable device that is identified to have impaired circuitry, one or more locations of the impaired circuitry. For example, the locations of the impaired circuitry may include one or more designations of at least one of a slice of logic blocks, a logic block, an element of a logic block, an interconnect element, or a configuration memory cell, that are impaired.

At block 708, the testing system may store, for each programmable device that is identified to have impaired circuitry, an indication of the locations of the impaired circuitry. The testing system may store this indication in at least one of: (1) a non-volatile memory, such as a one-time programmable register, of the programmable device or (2) a database. In this manner, a defect map may be subsequently generated for the programmable device, based on the locations of the impaired circuitry. For some examples, the one-time programmable register is an electronically fused register. In this case, storing the indication at block 708 may include blowing one or more fuse links to program one or more bits of the electronically fused register. For some examples, the database is stored on a server, such as a cloud computing server where the database is accessible via cloud computing (i.e., "the cloud"). Alternatively, the database information for each programmable device may reside on the device itself or the database may reside in a digital medium separate from the device. In the latter case, the manufacturing entity may ship the digital medium to the customer or transmit the digital medium (e.g., along with or after the sale of the programmable device).

At optional block 710 (as indicated by the dashed lines), the testing system may store, for each programmable device of the plurality of programmable devices, a unique identifier associated with each programmable device in the database. For example, the unique identifier may be stored in the non-volatile memory, such as in a one-time programmable register (e.g., a electronically fused register), of each programmable device.

Figure 8:
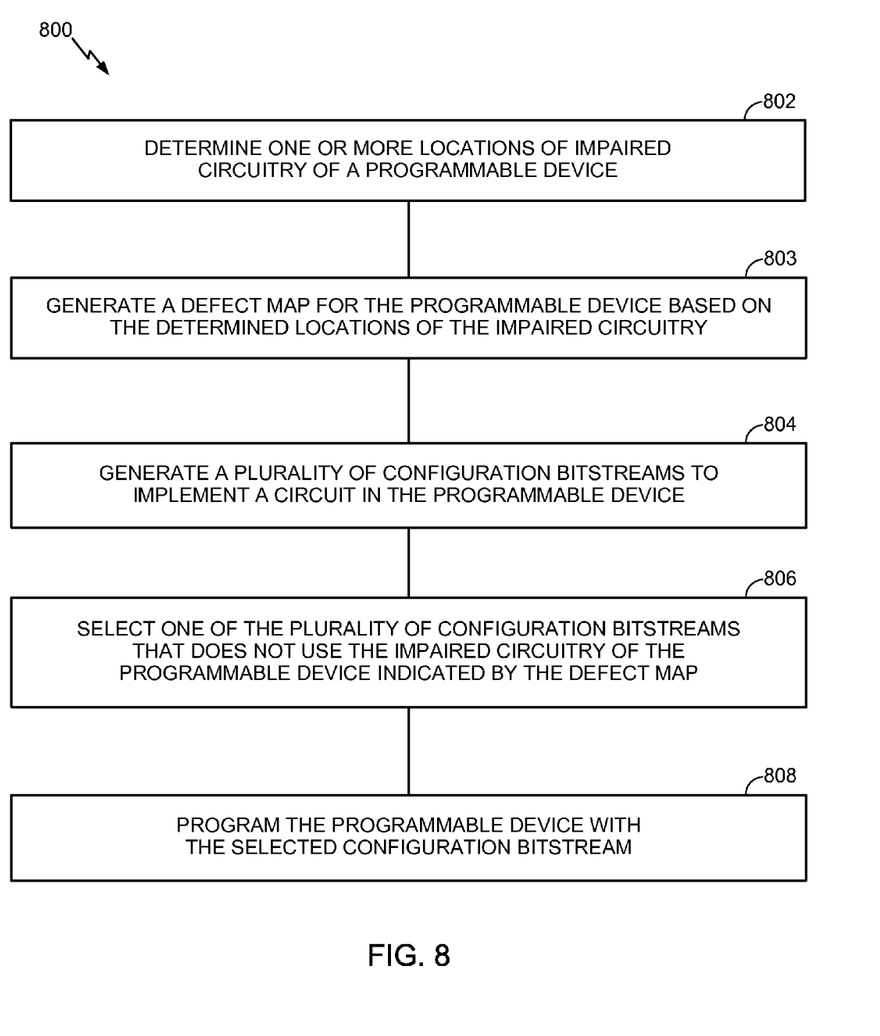
FIG. 8 is a flow diagram of example operations for enabling the use of a programmable device having impaired circuitry, from the perspective of a device programming entity, in accordance with an example of the present disclosure.

FIG. 8 is a flow diagram of example operations 800 for enabling the use of a programmable device having impaired circuitry (e.g., one or more defective and/or suspect portions), from the perspective of a programming entity, for example. The operations 800 may be performed, for example, by a customer's programming system with programming device 402, design software, and configuration software 516 as illustrated in FIGS. 4-5 and described above. For some examples, the design software and/or the configuration software 516 may run on the programming device 402, such as on the control circuit 404.

Figure 9:
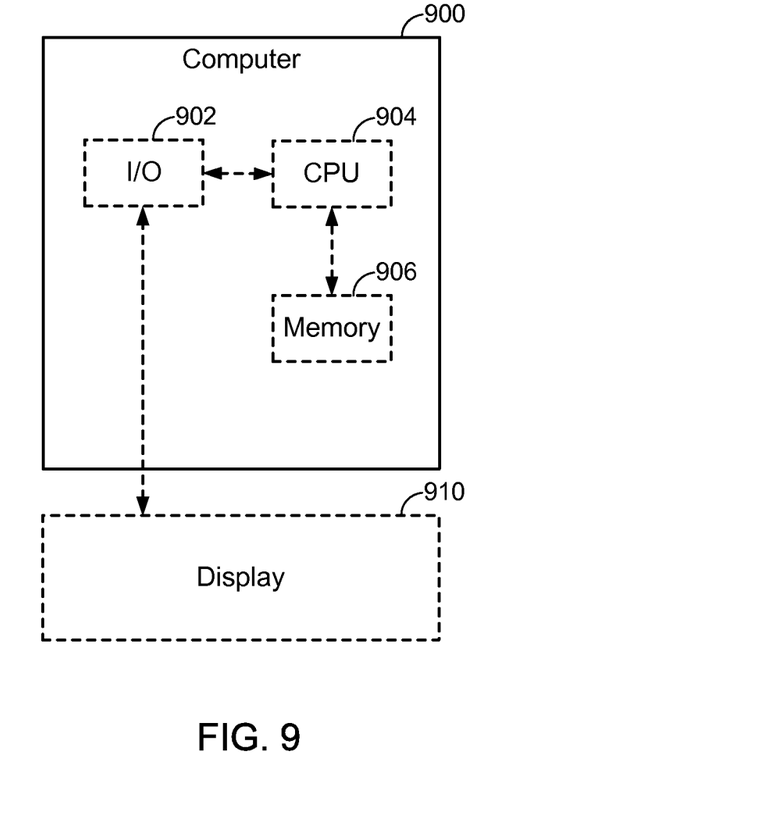
FIG. 9 is a block diagram of a general-purpose computer that may be used as a programming system for enabling the use of a programmable device having impaired circuitry, in accordance with an example of the present disclosure.

For other examples, the customer's programming system may be implemented with a general-purpose computer 900, as illustrated in FIG. 9. The computer 900 includes a central processing unit (CPU) 904, one or more input/output (I/O) ports 902 connected with the CPU 904, and a memory 906 connected with the CPU 904. Although shown as being internal to the computer 900, the memory 906 may also be external to the computer 900 or both internal and external thereto. The design software and/or the configuration software 516 may run on the CPU 904. For some examples, the computer 900 may also be connected with a display 910 (e.g., an LED display, plasma display, LCD display, cathode ray tube (CRT), and the like) via the I/O ports 902.

Returning to FIG. 8, the operations 800 may begin, at block 802, with the programming system determining one or more locations of the impaired circuitry of a programmable device. For example, the locations of the impaired circuitry may include one or more designations of at least one of a slice of logic blocks, a logic block, an element of a logic block, an interconnect element, or a configuration memory cell, that are impaired. The programming system may determine the locations by at least one of: (1) receiving an indication of the locations from a database or (2) reading a non-volatile memory (e.g., non-volatile memory 306 or register 305) of the programmable device having the indication of the locations stored therein.

According to some examples, the database is stored on a server, such as a cloud computing server (e.g., server 510) where the database is accessible via cloud computing (i.e., "the cloud"). For other examples, the database may reside on the programmable device itself or in a digital medium separate from the device, as described above.

According to some examples, the non-volatile memory of the programmable device includes a one-time programmable register (e.g., register 305). The one-time programmable register may be an electronically fused register, for example. In this case, the indication of the locations may include a combination of blown and pristine fuse links in the electronically fused register.

At block 803, the programming system (e.g., configuration software 516) may generate a defect map for the programmable device, based on the determined locations of the impaired circuitry from block 802. At block 804, the programming system may generate a plurality of configuration bitstreams to implement a circuit in the programmable device (e.g., to perform a desired application). At block 806, the programming system may select one of the plurality of configuration bitstreams that does not use the impaired circuitry of the programmable device indicated by the determined locations (or more specifically, the defect map). At block 808, the programming system may program the programmable device with the selected configuration bitstream. According to some examples, the operations 800 may further include testing the programmable device after being programmed with the selected configuration bitstream.

According to some examples, the operations 800 may further involve the programming system generating a resource usage map for each of the plurality of configuration bitstreams. In this case, the selecting at block 806 may entail comparing the defect map and the resource usage map for each of the plurality of configuration bitstreams, where the selected configuration bitstream has a corresponding resource usage map that does not include the impaired circuitry as indicated by the defect map.

According to some examples, the operations 800 may further involve the programming system determining a unique identifier associated with the programmable device. In this case, the programming system may access the database based on the unique identifier to obtain the indication of the locations of the impaired circuitry. For some examples, determining the unique identifier entails reading the unique identifier from the non-volatile memory of the programmable device (e.g., reading the bits in a device ID field stored in the one-time programmable register).

Any of the operations described above, such as the operations 700 and operations 800, may be included as instructions in a computer-readable medium for execution by a processing system, such as the test computer 202, programming device 402, or computer 900. The (non-transitory) computer-readable medium may comprise any suitable memory or other storage device for storing instructions, such as read-only memory (ROM), random access memory (RAM), flash memory, an electrically erasable programmable ROM (EEPROM), a compact disc ROM (CD-ROM), a floppy disk, or a digital versatile disc ROM (DVD-ROM).

As used herein (including the claims that follow), a phrase referring to "at least one of" a list of items refers to any combination of those items, including single members. As an example, "at least one of: a, b, or c" is intended to cover: a, b, c, a-b, a-c, b-c, a-b-c, and any combination thereof (e.g., a-b-b and a-a-b-c).

While the foregoing is directed to examples of the present disclosure, other and further examples of the disclosure may be devised without departing from the basic scope thereof, and the scope thereof is determined by the claims that follow.

What is claimed is:

1. A method of enabling the use of a programmable device having impaired circuitry, comprising:
    determining one or more locations of the impaired circuitry of the programmable device;
    generating a defect map for the programmable device based on the determined locations of the impaired circuitry;
    generating a plurality of configuration bitstreams to implement a circuit in the programmable device;
    selecting one of the plurality of configuration bitstreams that does not use the impaired circuitry indicated by the defect map; and
    programming the programmable device with the selected configuration bitstream.

2. The method of claim 1, further comprising:
    generating a resource usage map for each of the plurality of configuration bitstreams;
    wherein the selecting comprises comparing the defect map and the resource usage map for each of the plurality of configuration bitstreams; and
    wherein the selected configuration bitstream has a corresponding resource usage map that does not include the impaired circuitry as indicated by the defect map.

3. The method of claim 1, wherein determining the locations of the impaired circuitry comprises at least one of:
    receiving an indication of the locations from a database; or
    reading a non-volatile memory of the programmable device having the indication of the locations stored therein.

4. The method of claim 3, wherein determining the locations further comprises:
    determining a unique identifier associated with the programmable device; and
    accessing the database based on the unique identifier to obtain the locations of the impaired circuitry of the programmable device.

5. The method of claim 4, wherein determining the unique identifier comprises reading the unique identifier from the non-volatile memory of the programmable device.

6. The method of claim 3, wherein the database is stored on a cloud computing server and is accessible via cloud computing.

7. The method of claim 1, wherein:
    the non-volatile memory comprises an electronically fused register; and
    the indication of the locations comprises a combination of blown and pristine fuse links in the electronically fused register.

8. The method of claim 1, wherein the one or more locations of the impaired circuitry comprise one or more designations of at least one of a slice of logic blocks, a logic block, an element of a logic block, an interconnect element, or a configuration memory cell, that are impaired.

9. A non-transitory computer-readable medium for enabling the use of a programmable device having impaired circuitry, the computer-readable medium comprising instructions executable by a processing system to:
    determine one or more locations of the impaired circuitry of the programmable device;
    generate a defect map for the programmable device based on the determined locations of the impaired circuitry;
    generate a plurality of configuration bitstreams to implement a circuit in the programmable device;
    select one of the plurality of configuration bitstreams that does not use the impaired circuitry indicated by the defect map; and
    program the programmable device with the selected configuration bitstream.

10. The computer-readable medium of claim 9, further comprising instructions executable by the processing system to:
    generate a resource usage map for each of the plurality of configuration bitstreams;
    wherein the selecting comprises comparing the defect map and the resource usage map for each of the plurality of configuration bitstreams; and
    wherein the selected configuration bitstream has a corresponding resource usage map that does not include the impaired circuitry as indicated by the defect map.

11. The computer-readable medium of claim 9, wherein determining the locations of the impaired circuitry comprises at least one of:
    receiving an indication of the locations from a database; or
    reading a non-volatile memory of the programmable device having the indication of the locations stored therein.

12. The computer-readable medium of claim 11, wherein determining the locations further comprises:
    determining a unique identifier associated with the programmable device; and
    accessing the database based on the unique identifier to obtain the locations of the impaired circuitry.

13. The computer-readable medium of claim 9, wherein the one or more locations of the impaired circuitry comprise one or more designations of at least one of a slice of logic blocks, a logic block, an element of a logic block, an interconnect element, or a configuration memory cell, that are impaired.

14. An apparatus for enabling the use of a programmable device having impaired circuitry, comprising:
   a processing system programmed to:
      determine one or more locations of the impaired circuitry of the programmable device;
      generate a defect map for the programmable device based on the determined locations of the impaired circuitry;
      generate a plurality of configuration bitstreams to implement a circuit in the programmable device;
      select one of the plurality of configuration bitstreams that does not use the impaired circuitry indicated by the defect map; and
      program the programmable device with the selected configuration bitstream; and
   a memory coupled to the processing system and configured to store at least one of instructions for the processing system, the indication of the locations of the impaired circuitry, the defect map, or the plurality of configuration bitstreams.

15. The apparatus of claim 14, wherein the processing system is further programmed to:
   generate a resource usage map for each of the plurality of configuration bitstreams;
   wherein the processing system is programmed to select the one of the plurality of configuration bitstreams by comparing the defect map and the resource usage map for each of the plurality of configuration bitstreams; and
   wherein the selected configuration bitstream has a corresponding resource usage map that does not include the impaired circuitry as indicated by the defect map.

16. The apparatus of claim 14, wherein the processing system is programmed to determine the locations of the impaired circuitry by at least one of:
   receiving an indication of the locations from a database; or
   reading a non-volatile memory of the programmable device having the indication of the locations stored therein.

17. The apparatus of claim 16, wherein the processing system is further programmed to determine the locations by:
   determining a unique identifier associated with the programmable device; and
   accessing the database based on the unique identifier to obtain the locations of the impaired circuitry of the programmable device.

18. The apparatus of claim 17, wherein:
   the non-volatile memory comprises a one-time programmable register; and
   determining the unique identifier comprises reading the unique identifier from the one-time programmable register.

19. The apparatus of claim 16, wherein the database is stored on a cloud computing server and is accessible via cloud computing.

20. The apparatus of claim 14, wherein the one or more locations of the impaired circuitry comprise one or more designations of at least one of a slice of logic blocks, a logic block, an element of a logic block, an interconnect element, or a configuration memory cell, that are impaired.

* * * * *